United States Patent
Jiao (10) Patent No.: US 9,029,996 B2
(45) Date of Patent: May 12, 2015

(54) BONDING AND ELECTRICALLY COUPLING COMPONENTS

(75) Inventor: Jinbao Jiao, Buffalo Grove, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 572 days.

(21) Appl. No.: 12/907,690

(22) Filed: Oct. 19, 2010

(65) Prior Publication Data

US 2012/0090173 A1    Apr. 19, 2012

(51) Int. Cl.
   - *H01L 23/02* (2006.01)
   - *H05K 3/32* (2006.01)
   - *H05K 1/03* (2006.01)
   - *H05K 3/28* (2006.01)

(52) U.S. Cl.
   CPC ........... *H05K 3/321* (2013.01); *Y10T 29/53213* (2015.01); *Y10T 29/49174* (2015.01); *H05K 1/0306* (2013.01); *H05K 3/284* (2013.01); *H05K 2203/1178* (2013.01)

(58) Field of Classification Search
   CPC ............. H01L 2224/32225; H01L 2224/3223; H01L 2224/32227; H01L 2224/32235; H05K 1/0306; H05K 3/284; H05K 3/321
   USPC ..................................... 29/857–858; 257/686
   See application file for complete search history.

(56) References Cited

U.S. PATENT DOCUMENTS

| | | | |
|---|---|---|---|
| 6,414,397 B1* | 7/2002 | Sawamoto | 257/783 |
| 2006/0043579 A1* | 3/2006 | He et al. | 257/712 |
| 2007/0096282 A1* | 5/2007 | Shim et al. | 257/686 |
| 2008/0029869 A1* | 2/2008 | Kwon et al. | 257/686 |
| 2009/0039291 A1* | 2/2009 | Furuta et al. | 250/492.1 |
| 2010/0244229 A1* | 9/2010 | Vittu | 257/692 |

FOREIGN PATENT DOCUMENTS

EP    1993124 A1    11/2008

OTHER PUBLICATIONS

International Search Report dated Jan. 4, 2012 from corresponding International Patent Application No. PCT/ US2011/056678.

* cited by examiner

*Primary Examiner* — Shaun Campbell
*Assistant Examiner* — Raj R Gupta (57) ABSTRACT

Methods and systems for electrically coupling bonded components, including: a support layer, an electrically conductive wire supported by the support layer, and an electrically conductive adhesive, the electrically conductive adhesive being over the electrically conductive wire, the electrically conductive adhesive being electrically coupled to the electrically conductive wire, the electrically conductive adhesive extending beyond the electrically conductive wire onto the support layer, the electrically conductive adhesive being configured to adhesively bond to the support layer, the electrically conductive adhesive being configured to adhesively bond to one or more additional components above the electrically conductive adhesive, the electrically conductive wire being configured to be electrically coupled to the one or more additional components through the electrically conductive adhesive.

5 Claims, 6 Drawing Sheets

BONDING AND ELECTRICALLY COUPLING COMPONENTS

I. BACKGROUND

The invention relates generally to the field of bonding and electrically coupling components.

II. SUMMARY

In one respect, disclosed is a method for electrically coupling bonded components, the method comprising providing a support layer, supporting an electrically conductive wire with the support layer, placing an electrically conductive adhesive over the electrically conductive wire, the electrically conductive adhesive extending beyond the electrically conductive wire onto the support layer, the electrically conductive adhesive being electrically coupled to the electrically conductive wire, the electrically conductive adhesive being configured to adhesively bond to the support layer, the electrically conductive adhesive being configured to adhesively bond to one or more additional components above the electrically conductive adhesive, the electrically conductive wire being configured to be electrically coupled to the one or more additional components through the electrically conductive adhesive.

In another respect, disclosed is a system for electrically coupling bonded components, the system comprising a support layer, an electrically conductive wire supported by the support layer, and an electrically conductive adhesive, the electrically conductive adhesive being over the electrically conductive wire, the electrically conductive adhesive being electrically coupled to the electrically conductive wire, the electrically conductive adhesive extending beyond the electrically conductive wire onto the support layer, the electrically conductive adhesive being configured to adhesively bond to the support layer, the electrically conductive adhesive being configured to adhesively bond to one or more additional components above the electrically conductive adhesive, the electrically conductive wire being configured to be electrically coupled to the one or more additional components through the electrically conductive adhesive.

Numerous additional embodiments are also possible.

III. BRIEF DESCRIPTION OF THE DRAWINGS

Other objects and advantages of the invention may become apparent upon reading the detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

IV. DETAILED DESCRIPTION

One or more embodiments of the invention are described below. It should be noted that these and any other embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art.

In some embodiments, systems and methods are disclosed for bonding and electrically coupling components. In some embodiments, a support layer is provided, the support layer being configured to support an electrically conductive wire. The support layer may be an electrical insulator such as a ceramic or another type of printed circuit board. The electrically conductive wire may be made out of gold or other suitable metal/conductor. In some embodiments, one or more additional components/devices may be electrically coupled and physically coupled to electrically conductive wire and support layer assembly.

An electrically conductive adhesive may be placed over the electrically conductive wire. In some embodiments, the electrically conductive adhesive may be applied in such a way that the electrically conductive adhesive extends beyond the electrically conductive wire onto the support layer. In some embodiments, adhesion between the electrically conductive adhesive and support layer may further increase the physical coupling between the components. In some embodiments, the electrically conductive adhesive may be configured to adhere more strongly to the support layer than to the electrically conductive wire.

In some embodiments, one or more additional components may be physically as well as electrically coupled to the assembly. In some embodiments, a die may be attached to the assembly using the electrically conductive adhesive while also being electrically coupled to the electrically conductive wire. In some embodiments, a heat spreader may be placed between the die and the electrically conductive adhesive to achieve better heat dissipation, for example. In some embodiments, a copper heat spreader may be used.

Figure 1:
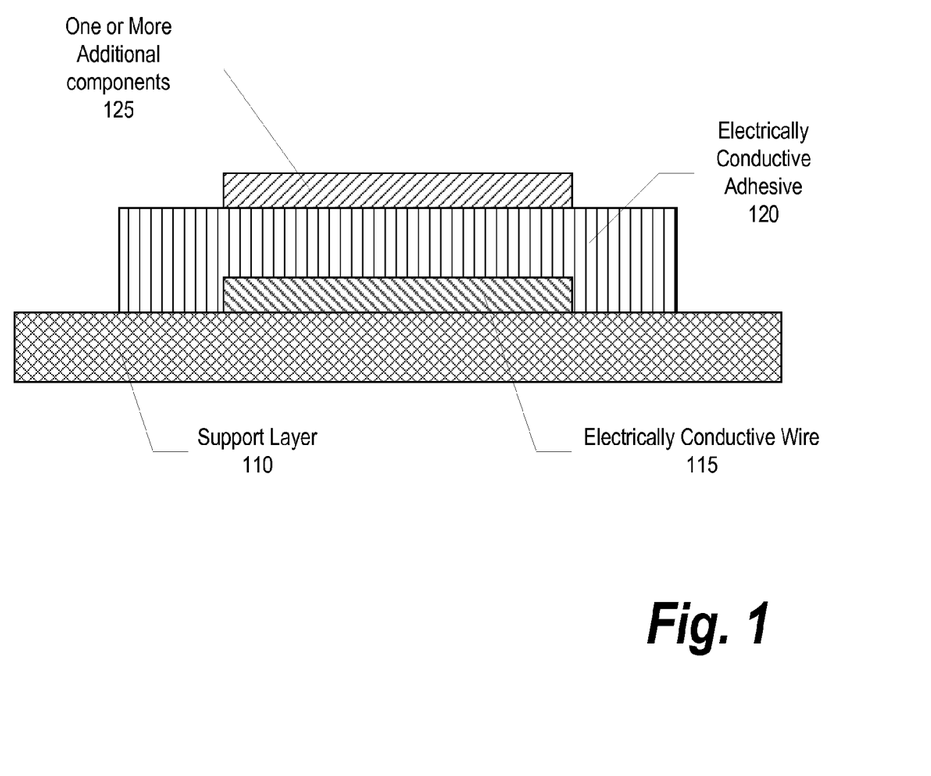
FIG. 1 is a cross sectional view of a system having electrically coupled bonded components, in accordance with some embodiments.

FIG. 1 is a cross sectional view of a system having electrically coupled bonded components, in accordance with some embodiments.

In some embodiments, support layer 110 is provided. In some embodiments, support layer 110 is an electrical insulator and configured to support directly and/or indirectly electrically conductive wire 115 as well as additional components.

Electrically conductive adhesive 120 may be placed over electrically conductive wire 115. In some embodiments, electrically conductive adhesive 120 may be applied in such a way that electrically conductive adhesive 120 extends beyond electrically conductive wire 115 onto support layer 110. In some embodiments, adhesion between electrically conductive adhesive 120 and support layer 110 further increases the physical bonding between the components. In some embodiments, electrically conductive adhesive 120 may be configured to adhere more strongly to support layer 110 than to electrically conductive wire 115.

In some embodiments, one or more additional components 125 may be physically and electrically coupled to the assembly. One or more additional components 125 may be electrically coupled and physically attached to electrically conductive wire 115 through electrically conductive adhesive 120. The physical attachment may be enhanced by the physical attachment of electrically conductive adhesive 120 to support layer 110.

Figure 2:
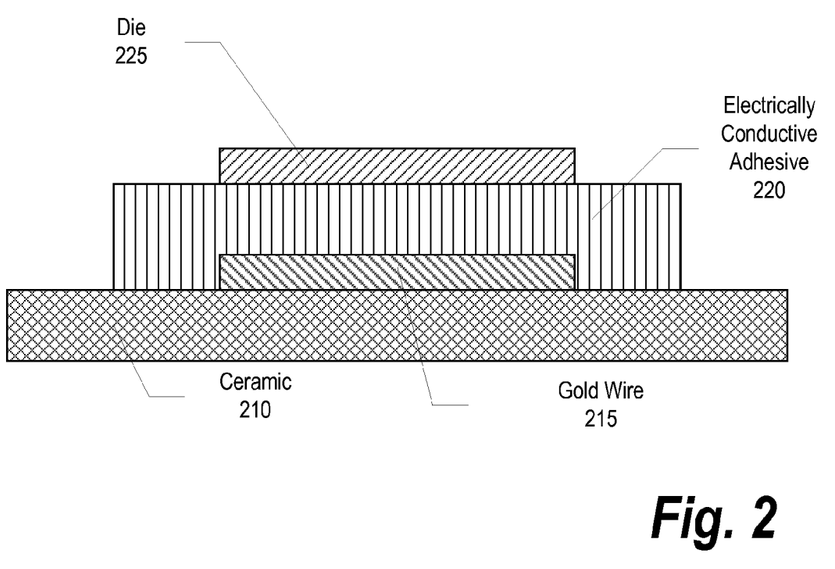
FIG. 2 is a cross sectional view of another system having electrically coupled bonded components, in accordance with some embodiments.

FIG. 2 is a cross sectional view of another system having electrically coupled bonded components, in accordance with some embodiments.

In some embodiments, ceramic 210 is provided. In some embodiments, ceramic 210 is an electrical insulator and configured to support directly and/or indirectly gold wire 215 as well as additional components.

Electrically conductive adhesive 220 may be placed over gold wire 215. In some embodiments, electrically conductive adhesive 220 may be applied in such a way that electrically conductive adhesive 220 extends beyond gold wire 215 onto ceramic 210. In some embodiments, adhesion between electrically conductive adhesive 220 and ceramic 210 further increases the physical bonding between the components. In some embodiments, electrically conductive adhesive 220 may be configured to adhere more strongly to ceramic 210 than to gold wire 215.

In some embodiments, die 225 may be physically and electrically coupled to the assembly. Die 225 may be electrically coupled and physically attached to gold wire 215 through electrically conductive adhesive 220. The physical attachment may be enhanced by the physical attachment of electrically conductive adhesive 220 to ceramic 210.

Figure 3:
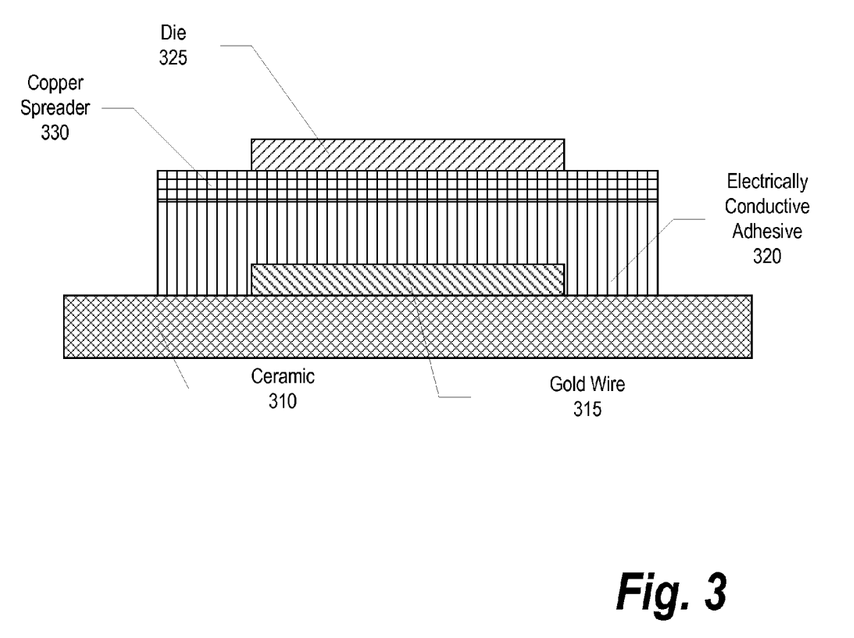
FIG. 3 is a cross sectional view of yet another system having electrically coupled bonded components, in accordance with some embodiments.

FIG. 3 is a cross sectional view of yet another system having electrically coupled bonded components, in accordance with some embodiments.

In some embodiments, ceramic 310 is provided. In some embodiments, ceramic 310 is an electrical insulator and configured to support directly and/or indirectly gold wire 315 as well as additional components.

Electrically conductive adhesive 320 may be placed over gold wire 315. In some embodiments, electrically conductive adhesive 320 may be applied in such a way that electrically conductive adhesive 320 extends beyond gold wire 315 onto ceramic 310. In some embodiments, adhesion between electrically conductive adhesive 320 and ceramic 310 further increases the physical bonding between the components. In some embodiments, electrically conductive adhesive 320 may be configured to adhere more strongly to ceramic 310 than to gold wire 315.

In some embodiments, copper spreader 330 and die 325 may be physically and electrically coupled to the assembly. Copper spreader 330 may be configured to aid in heat dissipation. Die 325 may be electrically coupled and physically attached to gold wire 315 through copper spreader 330 and electrically conductive adhesive 320. The physical attachment may be enhanced by the physical attachment of electrically conductive adhesive 320 to ceramic 310.

Figure 4:
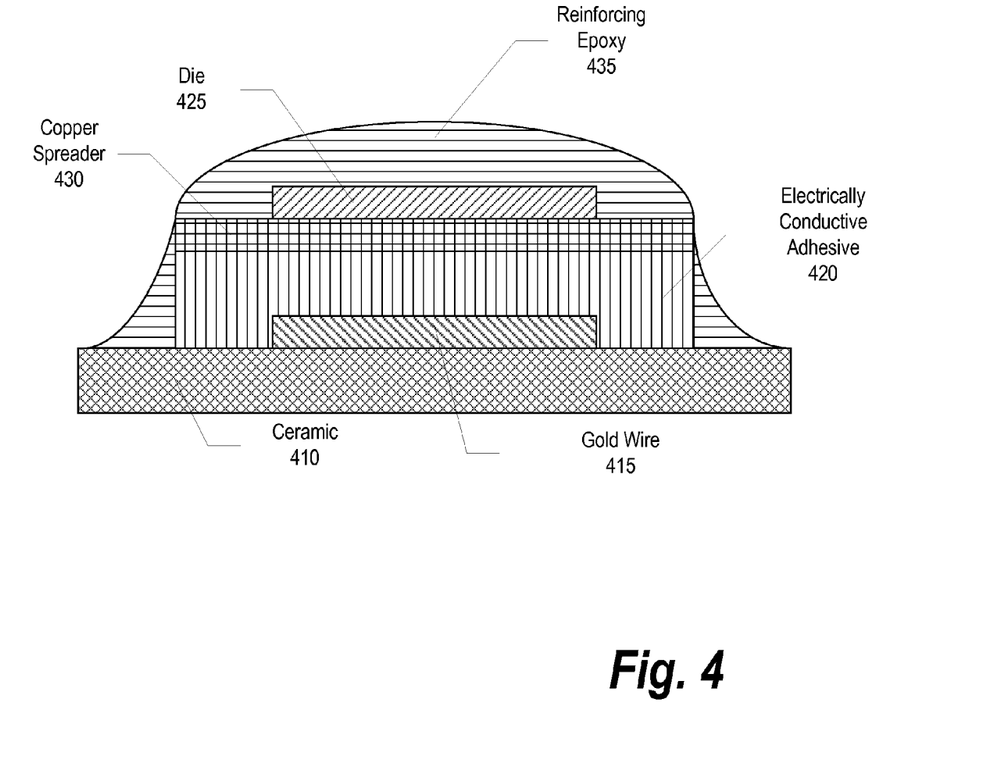
FIG. 4 is a cross sectional view of yet another alternative system having electrically coupled bonded components, in accordance with some embodiments.

FIG. 4 is a cross sectional view of yet another alternative system having electrically coupled bonded components, in accordance with some embodiments.

In some embodiments, ceramic 410 is provided. In some embodiments, ceramic 410 is an electrical insulator and configured to support directly and/or indirectly gold wire 415 as well as additional components.

Electrically conductive adhesive 420 may be placed over gold wire 415. In some embodiments, electrically conductive adhesive 420 may be applied in such a way that electrically conductive adhesive 420 extends beyond gold wire 415 onto ceramic 410. In some embodiments, adhesion between electrically conductive adhesive 420 and ceramic 410 further increases the physical bonding between the components. In some embodiments, electrically conductive adhesive 420 may be configured to adhere more strongly to ceramic 410 than to gold wire 415.

In some embodiments, copper spreader 430 and die 425 may be physically and electrically coupled to the assembly. Copper spreader 430 may be configured to aid in heat dissipation. Die 425 may be electrically coupled and physically attached to gold wire 415 through copper spreader 430 and electrically conductive adhesive 420. The physical attachment may be enhanced by the physical attachment of electrically conductive adhesive 420 to ceramic 410.

Reinforcing epoxy 435 may be added to the structure to enhance the physical bonding between the components. In some embodiments, one or more channels may be made through reinforcing epoxy 435 to allow for the curing of electrically conductive adhesive 420, etc.

Figure 5:
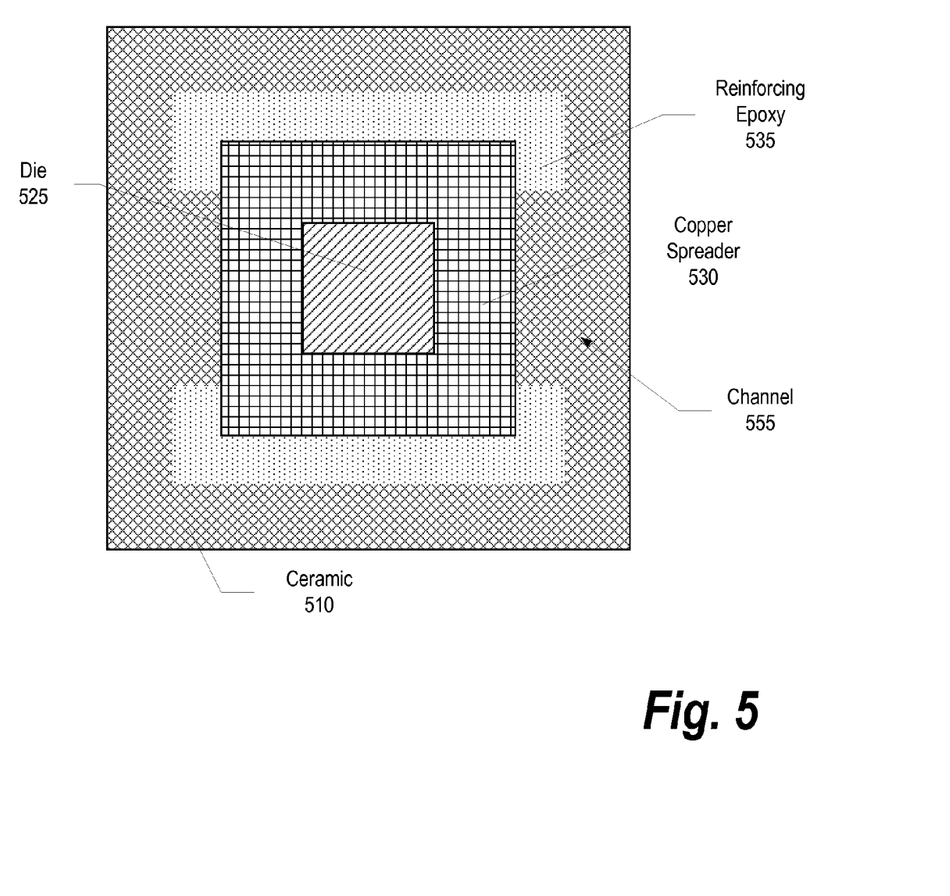
FIG. 5 is a top view of yet another system having electrically coupled bonded components, in accordance with some embodiments.

FIG. 5 is a top view of yet another system having electrically coupled bonded components, in accordance with some embodiments.

In some embodiments, ceramic 510 is provided. In some embodiments, ceramic 510 is an electrical insulator and configured to support directly and/or indirectly to one or more gold wires as well as additional components.

Electrically conductive adhesive may be placed over the one or more gold wires. In some embodiments, electrically conductive adhesive may be applied in such a way that electrically conductive adhesive extends beyond the one or more gold wires onto ceramic 510. In some embodiments, adhesion between the electrically conductive adhesive and ceramic 510 further increases the physical bonding between the components. In some embodiments, the electrically conductive adhesive may be configured to adhere more strongly to ceramic 510 than to the one or more gold wires.

In some embodiments, copper spreader 530 and die 525 may be physically and electrically coupled to the assembly. Copper spreader 530 may be configured to aid in heat dissipation. Die 525 may be electrically coupled and physically attached to the one or more gold wires through electrically conductive adhesive 520. The physical attachment may be enhanced by the physical attachment of the electrically conductive adhesive to ceramic 510.

Reinforcing epoxy 535 may be added to the structure to enhance the physical bonding of between the components. In some embodiments, one or more channels, such as channel 555, may be made through reinforcing epoxy 535 to allow for the curing of the electrically conductive adhesive, etc.

Figure 6:
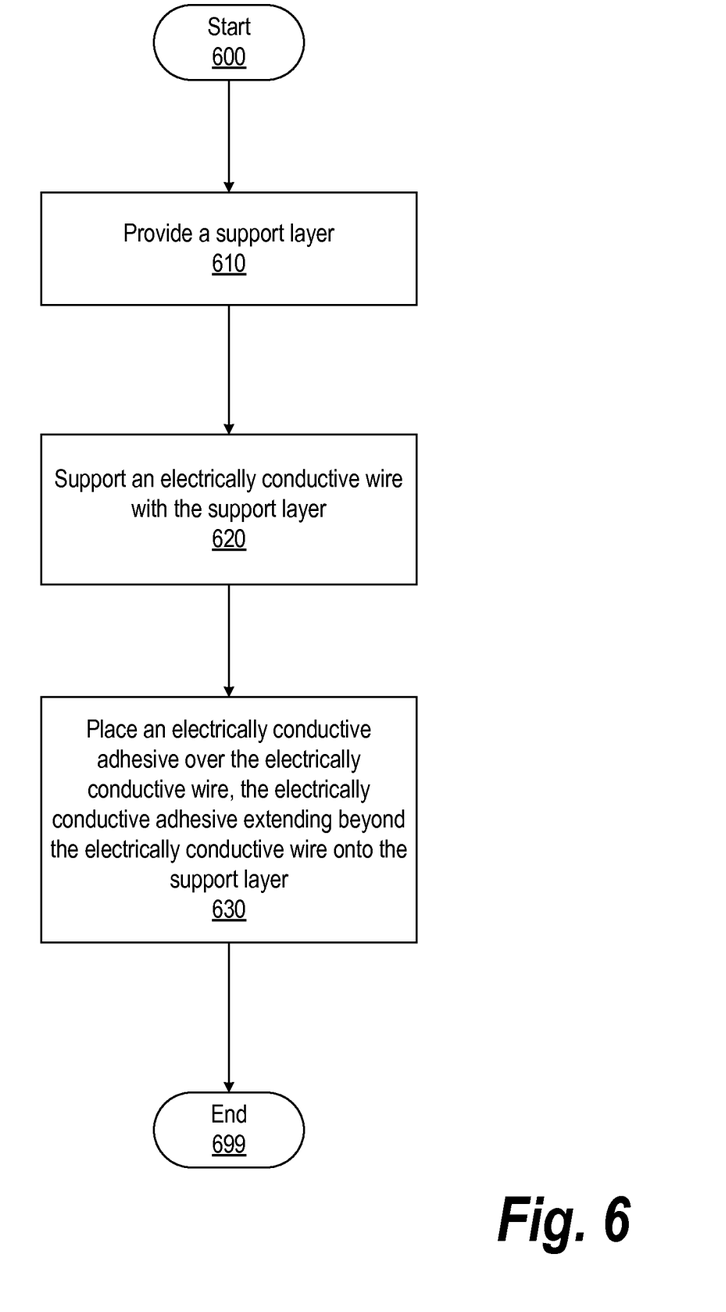
FIG. 6 is a flow diagram illustrating a method for electrically coupling bonded components, in accordance with some embodiments.

FIG. 6 is a flow diagram illustrating a method for electrically coupling bonded components, in accordance with some embodiments. In some embodiments, the methods described here may be implemented by a device such as the ones described in FIG. 1 through FIG. 5.

Processing begins at 600, whereupon, at block 610, a support layer is provided. At block 620, an electrically conductive wire is supported over the support layer.

At block 630, an electrically conductive adhesive is placed over the electrically conductive wire, the electrically conductive adhesive extending beyond the electrically conductive wire onto the support layer.

In some embodiments, the electrically conductive adhesive is electrically coupled to the electrically conductive wire.

In some embodiments, the electrically conductive adhesive is configured to adhesively bond to the support layer.

In some embodiments, the electrically conductive adhesive is configured to adhesively bond to one or more additional components above the electrically conductive adhesive.

In some embodiments, the electrically conductive wire is configured to be electrically coupled to the one or more additional components through the electrically conductive adhesive.

Processing subsequently ends at 699.

Those of skill will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system for electrically coupling bonded components to a support layer, the system comprising:
    a support layer, which is an electrical insulator, the support layer being substantially planar and rectangular with four sides, the four sides comprising first and second pairs of opposing sides;
    an electrically conductive wire on and supported by the support layer;
    an electrically conductive adhesive over the electrically conductive wire, the electrically conductive adhesive adhering to the electrically conductive wire and adhering to the support layer, the electrically conductive adhesive configured such that it extends beyond the electrically conductive wire and onto the support layer, the electrically conductive adhesive being selected such that it adheres to the support layer more strongly than it adheres to the electrically conductive layer;
    a substantially planar heat spreader layer located on top of, and attached to the electrically conductive adhesive, the heat spreader being substantially planar and rectangular with four sides, the four sides of the heat spreader comprising first and second pairs of opposing sides, the heat spreader additionally being metallic and configured to dissipate heat from a die placed on top of the heat spreader, the heat spreader being sized and shaped to cover substantially all of the electrically conductive adhesive over the electrically conductive wire, the first pair of opposing sides of the heat spreader being oriented to be substantially parallel to but laterally spaced away from the first pair of opposing sides of the support layer;
    a die located on top of and covering a portion of the heat spreader, the die being substantially planar and rectangular and having four sides, the four sides of the die comprising first and second pairs of opposing sides, the die additionally being electrically and physically attached to the electrically conductive wire through the electrically conductive adhesive, the die and heat spreader being sized and shaped such that the heat spreader extends laterally beyond the four sides of the die; and
    a reinforcing epoxy layer on top of the die, and on top of the portion of the heat spreader not covered by the die, the reinforcing epoxy layer extending over the first pair of opposing sides of the heat spreader but not extending over the second pair of opposing sides of the heat spreader, the reinforcing epoxy layer that extends over the first pair of opposing sides of the heat spreader additionally extending over electrically conductive adhesive that is below the first pair of opposing sides of the heat spreader and extends onto a portion of the support layer that is below and adjacent to the first pair of opposing sides of the heat spreader and adjacent the first pair of opposing sides of the support layer;
    whereby electrically conductive adhesive below the second pair of opposing sides of the heat spreader is not covered by the reinforcing epoxy layer and is exposed to air.

2. The system of claim 1, wherein the die comprises one or more additional components, electrical connections to which are through the conductive adhesive and not through the reinforcing epoxy layer.

3. The system of claim 1, wherein the heat spreader layer comprises copper and the support layer is a ceramic.

4. The system of claim 1, wherein the electrically conductive wire has an exterior surface, a first portion of the exterior surface being substantially horizontal, a second portion of exterior surface being substantially vertical, and wherein the electrically conductive adhesive is configured to cover, adhere to and make electrical contact with the substantially horizontal first portion and cover, adhere to and make electrical contact the substantially vertical second portion.

5. The system of claim 4, wherein the support layer is non-conductive and wherein the electrically conductive adhesive includes a portion that extends outwardly from the substantially vertical second portion and which adheres to the non-conductive support layer.

\* \* \* \* \*